United States Patent [19]
Smith

[11] Patent Number: 6,157,171
[45] Date of Patent: Dec. 5, 2000

[54] VOLTAGE MONITORING CIRCUIT FOR RECHARGEABLE BATTERY

[75] Inventor: Gregory J. Smith, Tucson, Ariz.

[73] Assignee: National Semiconductor Corporation, Santa Clara, Calif.

[21] Appl. No.: 09/021,430

[22] Filed: Feb. 10, 1998

[51] Int. Cl.[7] .................................................. H02J 7/00
[52] U.S. Cl. ........................................ 320/133; 320/136
[58] Field of Search ................................. 320/132, 133, 320/134, 136

[56] References Cited

U.S. PATENT DOCUMENTS

| | | | |
|---|---|---|---|
| 5,416,470 | 5/1995 | Tanaka et al. | 340/660 |
| 5,440,221 | 8/1995 | Landau et al. | 320/22 |
| 5,499,176 | 3/1996 | Erisman | 363/21 |
| 5,526,215 | 6/1996 | Higashijima et al. | 361/86 |
| 5,530,336 | 6/1996 | Eguchi et al. | 320/5 |
| 5,531,774 | 7/1996 | Schulman et al. | 607/56 |
| 5,534,788 | 7/1996 | Smith et al. | 324/771 |
| 5,631,537 | 5/1997 | Armstrong | 320/118 |
| 5,656,926 | 8/1997 | Ragsdale | 323/282 |
| 5,703,463 | 12/1997 | Smith | 320/134 |
| 5,898,293 | 4/1999 | Tamai et al. | 320/136 |

OTHER PUBLICATIONS

Unitrode Integrated Circuits data sheet, "Programmable Electronic Circuit Breaker", May 1995, (4 pages).
Linear Technology data sheet, "LTC1255 Dual 24V High–Side MOSFET Driver", 1994, p. 4–215.
Linear Technology data sheet, "LT1161 Quad Protected High–Side MOSFET Driver", 1994, p. 4–175.
Linear Technology data sheet, "LTC1154 High–Side Micropower MOSFET Driver", 1994, p. 4–152.
Linear Technology data sheet, "LTC1153 Auto–Reset Electronic Circuit Breaker", 1994, p. 4–138.
Texas Instruments advertisement, "It's a Power Switch for Real–World Protection", 1995, (1 page).
Maxim Integrated Products advertisement, "First High–Side Current–Sensing IC", 1995, (1 page).
Unitrode Integrated Circuits data sheet, "Electronic Circuit Breaker for Negative Supplies", May 1995 (5 pages).
Seiko Semiconductor data sheet, "Battery Protection IC S–8491 Series", 1995, (28 pages).

*Primary Examiner*—Peter S. Wong
*Assistant Examiner*—Lawrence Luk
*Attorney, Agent, or Firm*—Limbach & Limbach LLP

[57] ABSTRACT

An integrated circuit for monitoring the voltage of a rechargeable battery and controlling, in accordance with such monitored voltage, the charging and discharging of such rechargeable battery. While disconnecting or, alternatively, powering down all other power consuming circuitry, the unloaded battery voltage is sampled. The sampled voltage is then stored in isolation while the remaining circuitry is connected or powered up for normal operation. The stored voltage sample, free from errors induced by the otherwise normal operation of the battery monitoring circuit, is then compared to a reference voltage.

25 Claims, 5 Drawing Sheets

VOLTAGE MONITORING CIRCUIT FOR RECHARGEABLE BATTERY

BACKGROUND OF THE INVENTION

1. Field of the Invention

The present invention relates to voltage monitoring circuits, and in particular, to voltage monitoring circuits for rechargeable batteries used in low voltage applications.

2. Description of the Related Art

Voltage monitoring circuits play a key role in controlling the charging and discharging of rechargeable battery cells, such as lithium and lithium-ion battery cells used in portable electronic equipment such as portable computers. As is well known, lithium and lithium-ion secondary (i.e., rechargeable) battery cells require protection from prolonged over-charging and over-discharging so as to prevent degradation of the performance of the cells, as well as to prevent ruptures in the casing of the cells and combustion of the electrolyte within the cells.

In order to accomplish this, protection circuits, typically internal to the battery pack, monitor the individual cell voltages for over-charge and over-discharge conditions. Such circuits monitor the individual cell voltages to determine if a maximum or minimum cell voltage threshold has been crossed. For safety reasons, resistors are connected in series between the monitored cell terminal and the power and sensing terminals of the monitoring circuit. Such resistors are intended to limit any current that would flow from the battery cell in the event that a short circuit developed within the monitoring circuit.

Referring to FIG. 1, two terminals are typically used to connect the monitoring circuit to the monitored terminal of the battery cell. One terminal is used for sensing the cell voltage, while the other terminal is used for providing power to the monitoring circuit. Accordingly, six terminal connections are required: a voltage sensing connection for the positive cell terminal; a power connection to the positive cell terminal; a ground connection to the negative cell terminal; discharge and charge control terminal connections to the series-connected MOSFET switches; and a sensing connection at the negative terminal of the battery pack.

However, the use of such series resistors pose a number of problems. First, such resistors dissipate power which could otherwise be used more productively within the monitoring circuit itself. Second, since two resistors are required so that the voltage sensing circuit can make a more accurate measurement of the cell voltage without an offset introduced by current flowing through its resistor, an extra terminal is required for providing power via the power supply terminal (VDD) within the monitoring circuit.

One possible solution is the elimination of the safety resistors R1, R2. This would allow one terminal to be used for both power and sensing with minimal error. However, due to the aforementioned safety concerns, this is generally an unacceptable compromise.

Another possible solution is to attempt to correct for the offset introduced across the safety resistor due to the voltage drop caused by the power current. However, maintaining accuracy of such an offset correction is virtually impossible unless the magnitude of the power current can be held constant and predictable. Such consistency in power current, however, is virtually impossible due to variations caused by changes in operating modes, temperature, supply voltage and process variations. Hence, this solution is generally impractical and, therefore, also unacceptable.

Yet another possible solution is to design the voltage monitoring circuit such that its power current magnitude is so low as to generate an insignificant voltage drop across the safety resistor. However, circuits capable of operating in this manner result in internal resistive elements which are large in area and value, and with such low current values errors in accuracy are introduced by noise and leakage effects.

Referring to FIG. 2, one conventional technique samples the cell voltage via resistor R2 with a capacitive voltage divider. Initially switches S1 and S2 are in positions 1, thereby discharging capacitors C1 and C2. During sampling, switches S1 and S2 are in positions 2 and the divided cell voltage VS across capacitor C1 is compared in voltage comparator A1 with a reference voltage VREF generated by the reference voltage generator. Voltage comparator A1 and the reference voltage generator are powered by the battery cell via resistor R1.

Referring to FIG. 3, another conventional technique effectively merges the reference voltage generation and voltage comparison functions. The sampled voltage VS is buffered by buffer amplifier A2 and is used to drive a band gap voltage generator circuit. The resulting voltages V1, V2 are compared in voltage comparator A3 (with hysteresis). The resulting voltage comparison signal Vc is then used by the remainder of the control circuit (not shown) for generating the charge and discharge control signals for the MOSFET switches MC, MD. (Examples of such control circuits, many of which are well known in the art, can be found in U.S. patent application Ser. No. 08/801,162, filed Feb. 18, 1997, and entitled "Methods and Apparatus for Protecting Battery Cells from Overcharge," and in U.S. patent application Ser. No. 08/904,138, filed Jul. 31, 1997, and entitled "Bidirectional Current Control Circuit Suitable for Controlling the Charging and Discharging of Rechargeable Battery Cells," the disclosures of which are incorporated herein by reference.)

Accordingly, it would be desirable to have a technique by which accurate voltage monitoring can be performed with fewer battery cell connections required, while maintaining safeguards against potential short circuit conditions.

SUMMARY OF THE INVENTION

A voltage monitoring circuit and method for use in monitoring the voltage of a rechargeable battery cell uses a time-multiplexed connection to the battery cell for alternately sampling the cell voltage and powering the voltage monitoring circuitry. The cell voltage is sampled and held while the higher power consuming voltage monitoring circuitry is powered down. The sampling circuitry is then disconnected, with the sampled cell voltage held therein, while the remaining circuitry is powered up to compare the sampled and held cell voltage against a reference voltage. Accordingly, an error-free cell voltage is acquired for comparison to a known reference voltage.

In accordance with one embodiment of the present invention, a voltage monitoring circuit suitable for use in monitoring the voltage of a rechargeable battery includes battery connection nodes, a resistive circuit, a switching circuit, a voltage sampling circuit and a voltage measurement circuit. The battery connection nodes are configured to connect to the terminals of a rechargeable battery. The resistive circuit includes first and second terminals, with the first resistive circuit terminal being connected to the first battery connection node. The switching circuit includes an input terminal and first and second output terminals, with the switching circuit input terminal being connected to the second resistive circuit terminal and the switching circuit being configured to: connect the switching circuit input terminal to the first switching circuit output terminal and disconnect the switching circuit input terminal tom the second switching circuit output terminal during a first time period; and connect the switching circuit input terminal to the second switching circuit output terminal and disconnect the switching circuit input terminal from the first switching circuit output terminal during a second time period. The voltage sampling circuit is connected between the first switching circuit output terminal and the second battery connection node and is configured to sample a voltage between the first and second battery connection nodes via the resistive circuit and the switching circuit during the first time period and in accordance therewith provide a stored voltage corresponding to the sampled voltage. The voltage measurement circuit is connected between the second switching circuit output terminal and the second battery connection node and is configured to measure the stored voltage during the second time period.

In accordance with another embodiment of the present invention, an integrated circuit (IC) for monitoring a voltage of a rechargeable battery within a battery circuit which also includes a charging and discharging control circuit and for controlling, in accordance with the monitored voltage, charging and discharging of the rechargeable battery includes five IC terminals and a voltage measuring circuit. The first IC terminal is configured to connect via a resistor to a first terminal of a rechargeable battery within a battery circuit which includes the rechargeable battery and a charging and discharging control circuit for controlling charging and discharging of the rechargeable battery, with the first rechargeable battery terminal providing a first path for conveying charging and discharging currents of the rechargeable battery at a first voltage polarity. The second IC terminal is configured to connect to a second terminal of the rechargeable battery, with the second rechargeable battery terminal providing a second path which is complementary to the first path for conveying the charging and discharging currents of the rechargeable battery at a second voltage polarity which is opposite to the first voltage polarity. The third IC terminal is configured to connect to a sensing terminal of the battery circuit which provides a third path for conveying in cooperation with the second path the charging and discharging currents of the rechargeable battery substantially at the second voltage polarity. The fourth IC terminal is configured to connect and provide a discharge control signal to a first portion of the charging and discharging control circuit which is connected between the second rechargeable battery terminal and the battery circuit sensing terminal and is configured to control the discharging of the rechargeable battery. The fifth IC terminal is configured to connect and provide a charge control signal to a second portion of the charging and discharging control circuit which is connected between the second rechargeable battery terminal and the battery circuit sensing terminal and is configured to control the charging of the rechargeable battery. The voltage measuring circuit is connected to the first, second, third, fourth and fifth IC terminals and is configured to: sample a voltage between the first and second IC terminals during a first time period; store the sampled voltage; and measure the stored sampled voltage and in accordance therewith generate the discharge and charge control signals.

In accordance with yet another embodiment of the present invention, a voltage monitoring circuit suitable for use in monitoring the voltage of a rechargeable battery includes battery connection nodes, a resistive circuit, a control circuit, a voltage sampling circuit and a voltage measurement circuit. The battery connection nodes are configured to connect to the terminals of a rechargeable battery. The resistive circuit includes first and second terminals, with the first resistive circuit terminal being connected to the first battery connection node. The control circuit is connected between the second resistive circuit terminal and the second battery connection node and is configured to provide a plurality of control signals. The voltage sampling circuit is connected to the control circuit and between the second resistive circuit terminal and the second battery connection node and is configured to receive a portion of the plurality of control signals and in accordance therewith sample a voltage between the first and second battery connection nodes via the resistive circuit during a first time period and in accordance therewith provide a stored voltage corresponding to the sampled voltage. The voltage measurement circuit is connected to the control circuit and between the second resistive circuit terminal and the second battery connection node and is configured to receive another portion of the plurality of control signals and in accordance therewith: during the first time period, draw substantially no supply current from the rechargeable battery via the resistive circuit; and, during a second time period, draw a supply current from the rechargeable battery via the resistive circuit and measure the stored voltage.

These and other features and advantages of the present invention will be understood upon consideration of the following detailed description of the invention and the accompanying drawings.

DETAILED DESCRIPTION OF THE INVENTION

Figure 4:
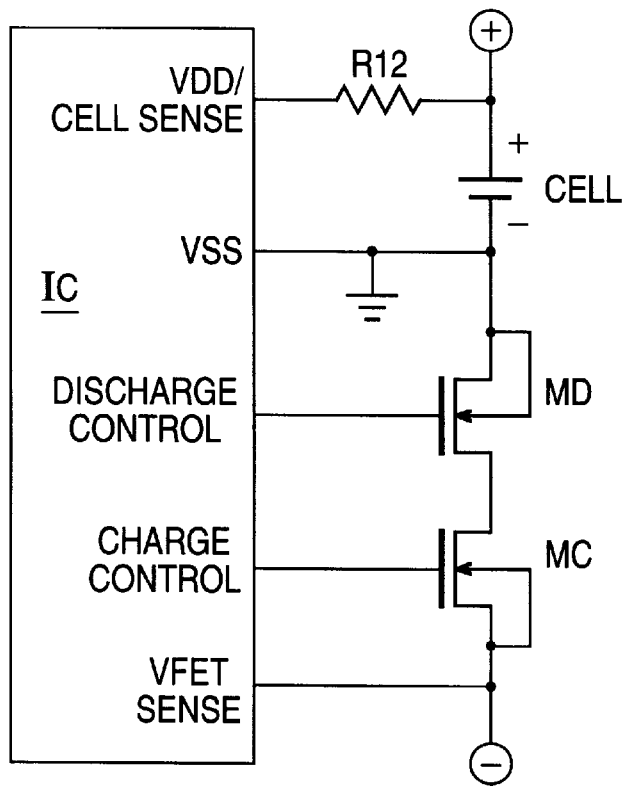
FIG. 4 is a functional block and schematic diagram of a circuit for controlling the charging and discharging of a rechargeable battery cell in accordance with one embodiment of the present invention.

Referring to FIG. 4, a voltage monitoring circuit suitable for use in monitoring the voltage of the rechargeable battery cell in accordance with one embodiment of the present invention can be used in an integrated circuit IC which requires only five connections for monitoring the cell voltage and controlling the charging and discharging of such cell. Only one safety resistor R12 is required, while still providing for a high degree of accuracy while monitoring the cell voltage.

Figure 5:
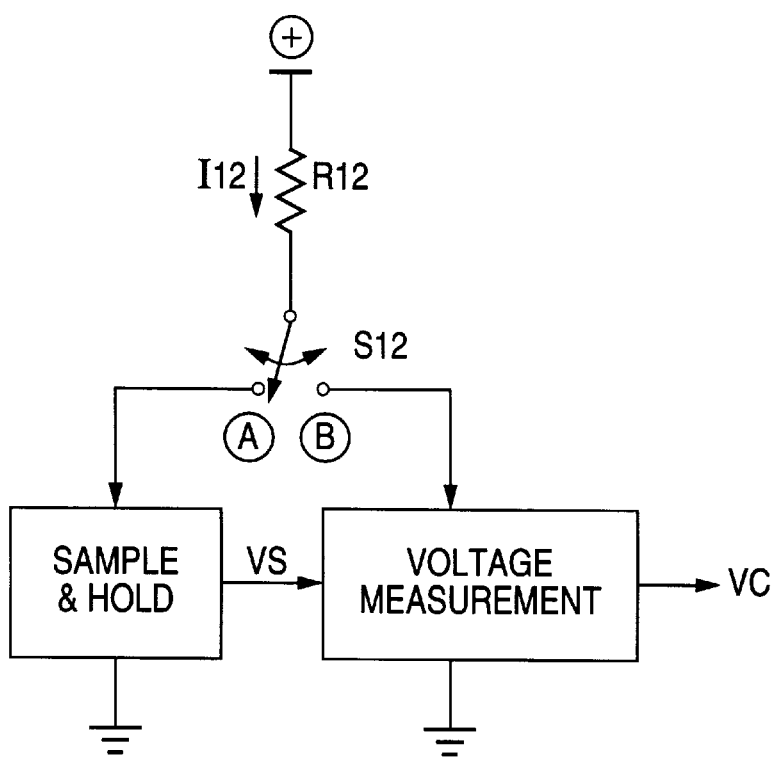
FIG. 5 is a functional block and schematic diagram of a voltage monitoring circuit in accordance with one embodiment of the present invention.

Referring to FIG. 5, a time multiplexing capability is provided by a single pole, double throw switch S12 (or its equivalent) which alternately connects the positive terminal of the battery cell, via resistor R12, to a sample and hold circuit and a voltage measurement circuit. When in position A, the switch S12 allows the sample and hold circuit to sample the battery cell voltage. Such sampled voltage VS is held for subsequent use by the voltage measurement circuit during the time that switch S12 is in position B. Hence, during the time the voltage measurement circuit is operating, any voltage offset produced across resistor R12 due to the supply current I12 for the voltage measurement circuit will not produce an error in the sampled cell voltage VS.

Figure 6:
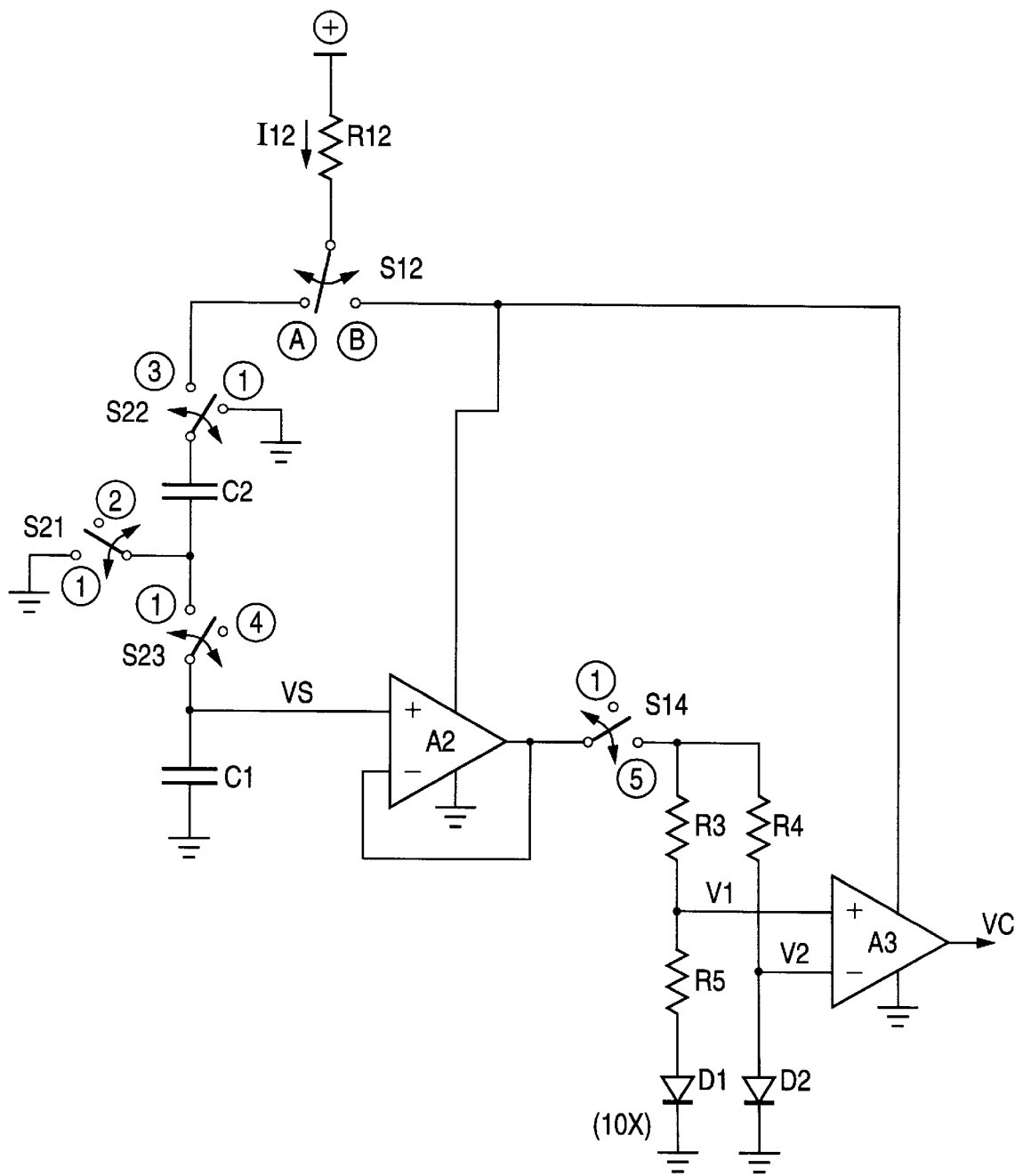
FIG. 6 is a schematic diagram of one embodiment of a circuit for performing the sample and hold and voltage measurement functions of the circuit of FIG. 5.

Referring to FIG. 6, one example of a circuit for performing the sample and hold and voltage measurement functions represented in FIG. 5 can be implemented as shown. During the time that switch S12 is in position A, capacitors C1 and C2, in cooperation with switches S21, S22, and S23, sample and hold the battery cell voltage. During a first portion of the sample period, switches S21, S22, and S23 are in positions 1, thereby discharging capacitors C1 and C2. Subsequently, switch S21 opens, i.e., switches to position 2. Subsequent to that, switch S22 switches to position 3. It is at this point in time that the battery cell voltage charges capacitors C1 and C2, with the divided voltage across C1 providing the actual sample voltage VS. Further subsequently, switch S23 opens, i.e., switches to position 4. This results in the sample voltage VS being held across capacitor C1.

Switch S12 then switches to position B for the voltage measurement mode of operation. The sample voltage VS is buffered by buffer amplifier A2 and switch S14 closes, i.e., switches from position 1 to position 5. This results in the buffered sample voltage generating voltages V1 and V2 (in accordance with well known principles) which are then compared by a voltage comparator A3 (with hysteresis).

Figure 8A:
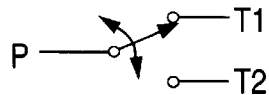
FIGS. 8A, 8B and 8C are schematic diagrams of suggested implementations of a single pole, double throw switch for use in a voltage monitoring circuit in accordance with the present invention.
Figure 8B:
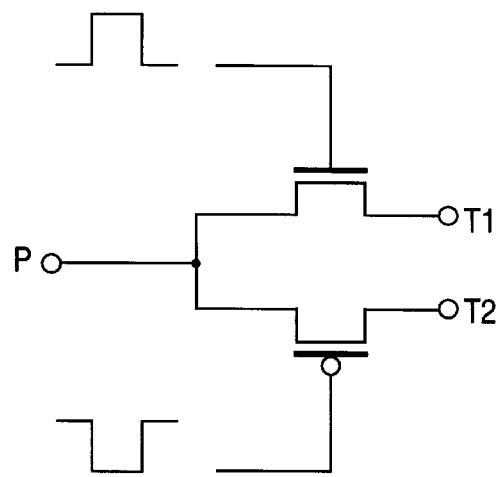
Figure 8C:
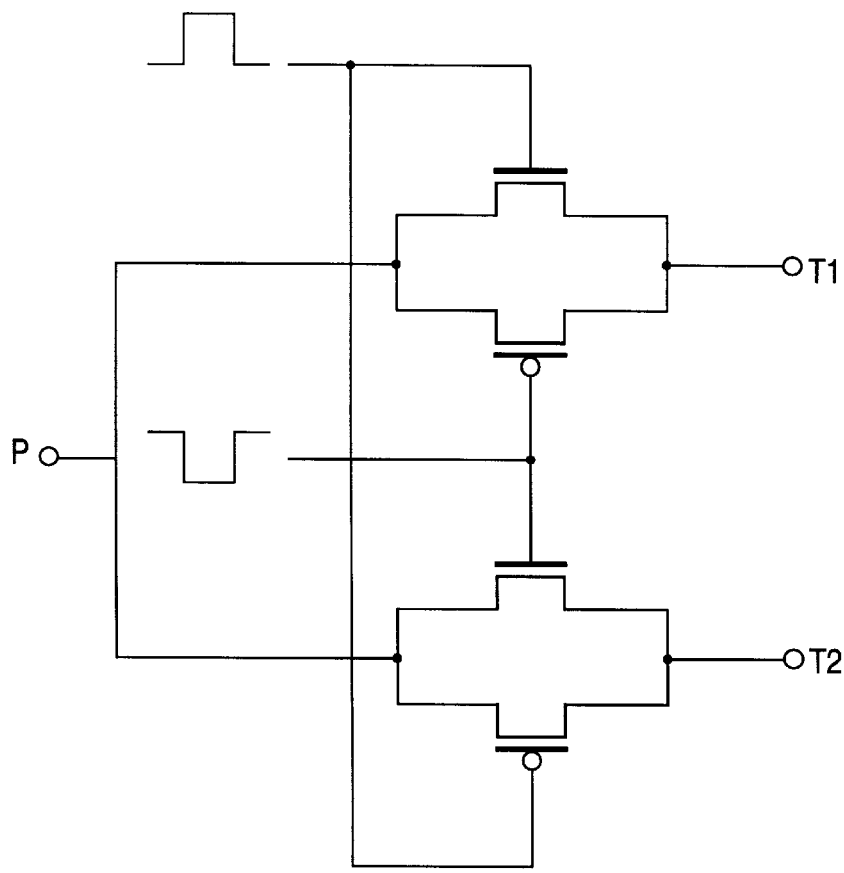

In accordance with well known techniques, the aforementioned switches can be implemented by various combinations of pass transistors interconnected individually or together as transmission gates. For example, referring to FIGS. 8A, 8B and 8C, it is well known that a single pole (P), double throw (T1, T2) switch (FIG. 8A) can be implemented as a set of pass transistors (FIG. 8B) or as sets of pass transistors connected as transmission gates (FIG. 8C). Additionally, particularly in an integrated circuit implementation, the capacitors can be implemented using appropriately biased MOSFETs. Further, if the buffer amplifier A2 is implemented in such a manner that its quiescent current drain is virtually nil absent any output current drain, its power supply connection can be made directly at the low side of resistor R12, i.e., the "pole" position, since it will not introduce an offset voltage across resistor R12 which would affect the accuracy of the cell voltage being sampled by the capacitors C1, C2.

Figure 1:
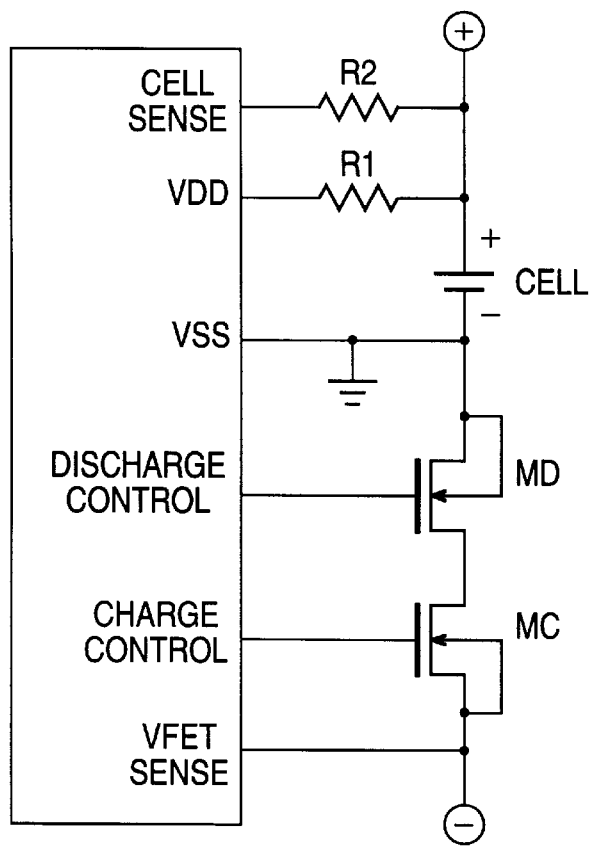
FIG. 1 is a functional block and schematic diagram of a conventional circuit for controlling the charging and discharging of a rechargeable battery cell.
Figure 2:
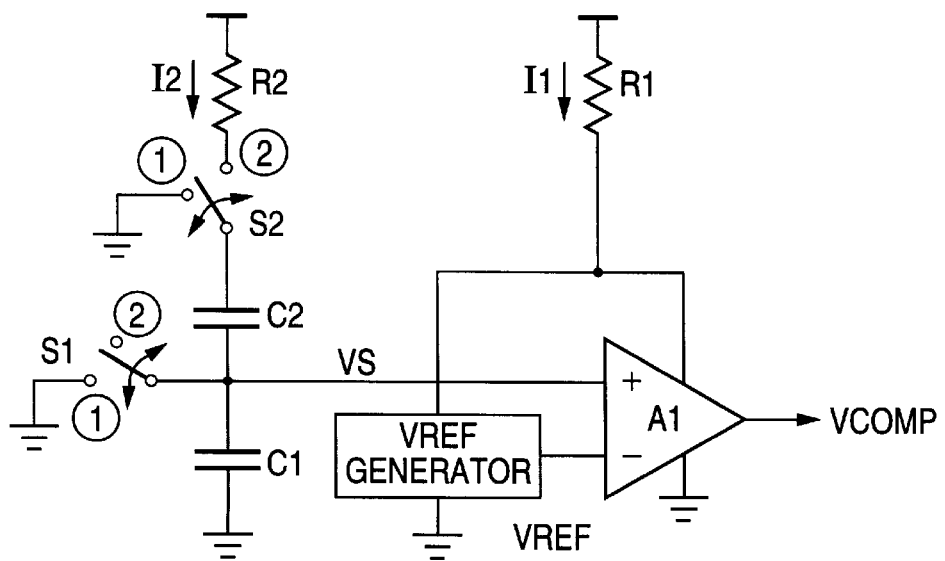
FIG. 2 is a schematic diagram of a conventional voltage monitoring circuit for use in the circuit of FIG. 1.
Figure 3:
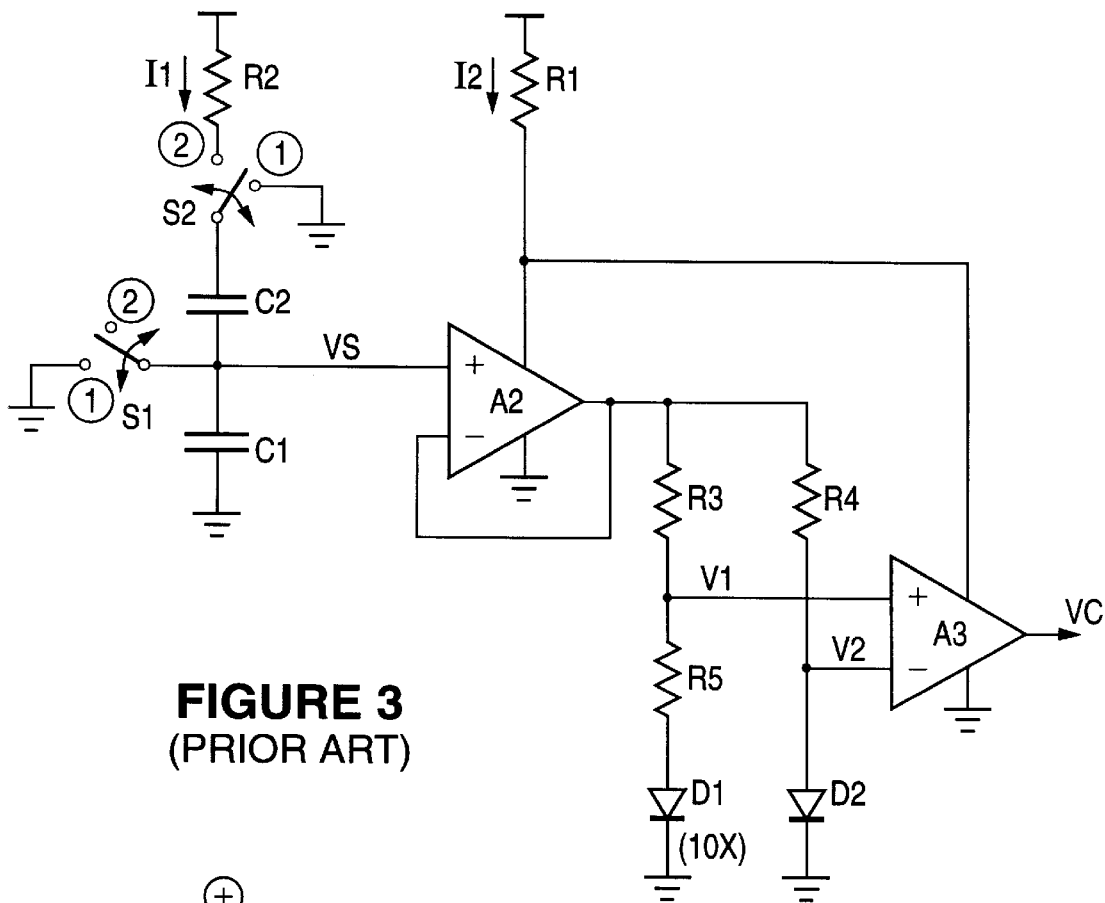
FIG. 3 is a schematic diagram of another conventional voltage monitoring circuit for use in the circuit of FIG. 1.
Figure 7:
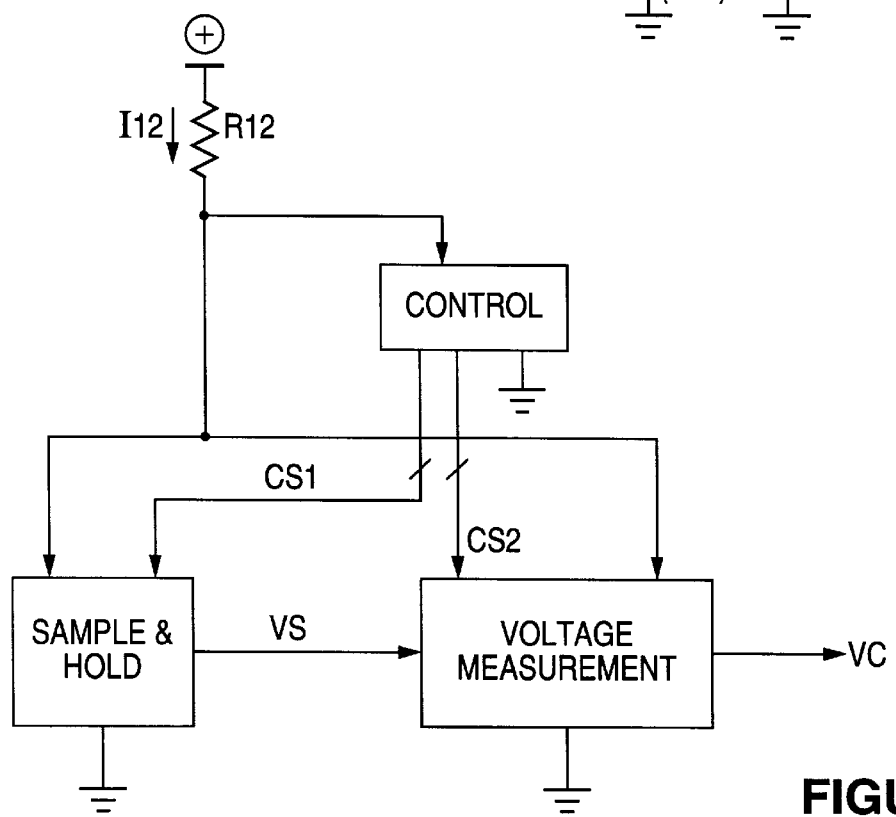
FIG. 7 is a functional block and schematic diagram of a voltage monitoring circuit in accordance with another embodiment of the present invention.

Referring to FIG. 7, such an implementation could be configured as shown. The sample and hold circuit and voltage measurement circuit would both be connected directly to safety resistor R12, as would a control circuit which would be responsible for controlling the operations of the sample and hold and voltage measurement circuits. During the sampling period when the sample and hold circuit is sampling the battery voltage, the voltage measurement circuit would be in a powered down state of operation. Following that, after the sample voltage VS has been stored and isolated (e.g., per the foregoing discussion), the voltage measurement circuit would be powered up, whereupon the voltage measurement circuit would draw a supply current I12 via safety resistor R12 while performing its voltage measurement function. The control circuit provides a set of control signals of which one subset CS1 controls the operation of the sample and hold circuit and another subset CS2 controls the operation of the voltage measurement circuit.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a voltage monitoring circuit suitable for use in monitoring the voltage of a rechargeable battery, comprising:

first and second battery connection nodes configured to connect to first and second terminals, respectively, of a rechargeable battery;

a resistive circuit with first and second terminals, wherein said first resistive circuit terminal is connected to said first battery connection node;

a switching circuit with an input terminal and first and second output terminals, wherein said switching circuit input terminal is connected to said second resistive circuit terminal and said switching circuit is configured to connect said switching circuit input terminal to said first switching circuit output terminal and disconnect said switching circuit input terminal from said second switching circuit output terminal during a first time period, and connect said switching circuit input terminal to said second switching circuit output terminal and disconnect said switching circuit input terminal from said first switching circuit output terminal during a second time period;

a voltage sampling circuit, connected between said first switching circuit output terminal and said second battery connection node, configured to sample a voltage between said first and second battery connection nodes via said resistive circuit and said switching circuit during said first time period and in accordance therewith provide a stored voltage corresponding to said sampled voltage; and a voltage measurement circuit, connected between said second switching circuit output terminal and said second battery connection node, configured to measure said stored voltage during said second time period.

2. The apparatus of claim 1, wherein said resistive circuit comprises a fixed resistor.

3. The apparatus of claim 1, wherein said switching circuit comprises a plurality of pass transistors.

4. The apparatus of claim 3, wherein:

a first portion of said plurality of pass transistors is configured to connect said switching circuit input terminal to said first switching circuit output terminal during said first time period, and disconnect said switching circuit input terminal from said first switching circuit output terminal during said second time period; and a second portion of said plurality of pass transistors is configured to disconnect said switching circuit input terminal from said second switching circuit output terminal during said first time period, and connect said switching circuit input terminal to said second switching circuit output terminal during said second time period.

5. The apparatus of claim 1, wherein said voltage sampling circuit comprises a capacitive circuit configured to receive said sampled voltage and in accordance therewith provide said stored voltage.

6. The apparatus of claim 1, wherein said voltage measurement circuit comprises a voltage comparison circuit configured to compare a plurality of voltages in accordance with said stored voltage.

7. An apparatus including an integrated circuit (IC) for monitoring a voltage of a rechargeable battery within a battery circuit which also includes a charging and discharging control circuit and for controlling, in accordance with said monitored voltage, charging and discharging of said rechargeable battery, said IC comprising:

a first IC terminal configured to connect via a resistor to a first terminal of a rechargeable battery within a battery circuit which includes said rechargeable battery and a charging and discharging control circuit for controlling charging and discharging of said rechargeable battery, wherein said first rechargeable battery terminal provides a first path for conveying charging and discharging currents of said rechargeable battery at a first voltage polarity;

a second IC terminal configured to connect to a second terminal of said rechargeable battery, wherein said second rechargeable battery terminal provides a second path which is complementary to said first path for conveying said charging and discharging currents of said rechargeable battery at a second voltage polarity which is opposite to said first voltage polarity;

a third IC terminal configured to connect to a sensing terminal of said battery circuit which provides a third path for conveying in cooperation with said second path said charging and discharging currents of said rechargeable battery substantially at said second voltage polarity;

a fourth IC terminal configured to connect and provide a discharge control signal to a first portion of said charging and discharging control circuit which is connected between said second rechargeable battery terminal and said battery circuit sensing terminal and is configured to control said discharging of said rechargeable battery;

a fifth IC terminal configured to connect and provide a charge control signal to a second portion of said charging and discharging control circuit which is connected between said second rechargeable battery terminal and said battery circuit sensing terminal and is configured to control said charging of said rechargeable battery; and a voltage measuring circuit, connected to said first, second, third, fourth and fifth IC terminals, configured to sample a voltage between said first and second IC terminals during a first time period, store said sampled voltage, and measure said stored sampled voltage and in accordance therewith generate said discharge and charge control signals.

8. The apparatus of claim 7, wherein said voltage measuring circuit comprises:

a switching circuit with an input node and first and second output nodes, wherein said switching circuit input node is connected to said first IC terminal and said switching circuit is configured to connect said switching circuit input node to said first switching circuit output node and disconnect said switching circuit input node from said second switching circuit output node during said first time period, and connect said switching circuit input node to said second switching circuit output node and disconnect said switching circuit input node from said first switching circuit output node during said second time period;

a voltage sampling circuit, connected between said first switching circuit output node and said second IC terminal, configured to sample said voltage between said first and second IC terminals via said switching circuit during said first time period and in accordance therewith provide a stored voltage corresponding to said sampled voltage; and a voltage measurement circuit, connected between said second switching circuit output node and said second IC terminal, configured to measure said stored voltage during said second time period and in accordance therewith generate said discharge and charge control signals.

9. The apparatus of claim 8, wherein said switching circuit comprises a plurality of pass transistors.

10. The apparatus of claim 9, wherein:

a first portion of said plurality of pass transistors is configured to connect said switching circuit input node to said first switching circuit output node during said first time period, and disconnect said switching circuit input node from said first switching circuit output node during said second time period; and a second portion of said plurality of pass transistors is configured to disconnect said switching circuit input node from said second switching circuit output node during said first time period, and connect said switching circuit input node to said second switching circuit output node during said second time period.

11. The apparatus of claim 8, wherein said voltage sampling circuit comprises a capacitive circuit configured to receive said sampled voltage and in accordance therewith provide said stored voltage.

12. The apparatus of claim 8, wherein said voltage measurement circuit comprises a voltage comparison circuit configured to compare a plurality of voltages in accordance with said stored voltage.

13. An apparatus including a voltage monitoring circuit suitable for use in monitoring the voltage of a rechargeable battery, comprising:

first and second battery connection nodes configured to connect to first and second terminals, respectively, of a rechargeable battery;

a resistive circuit with first and second terminals, wherein said first resistive circuit terminal is connected to said first battery connection node;

a control circuit, connected between said second resistive circuit terminal and said second battery connection node, configured to provide a plurality of control signals;

a voltage sampling circuit, connected to said control circuit and between said second resistive circuit terminal and said second battery connection node, configured to receive a portion of said plurality of control signals and in accordance therewith sample a voltage between said first and second battery connection nodes via said resistive circuit during a first time period and in accordance therewith provide a stored voltage corresponding to said sampled voltage; and a voltage measurement circuit, connected to said control circuit and between said second resistive circuit terminal and said second battery connection node, configured to receive another portion of said plurality of control signals and in accordance therewith during said first time period, draw substantially no supply current from said rechargeable battery via said resistive circuit, and during a second time period, draw a supply current from said rechargeable battery via said resistive circuit and measure said stored voltage.

14. The apparatus of claim 13, wherein said resistive circuit comprises a fixed resistor.

15. The apparatus of claim 13, wherein said control circuit comprises a signal generator configured to generate a plurality of switch control signals as said portion of said plurality of control signals and to generate a circuit power control signal as said another portion of said plurality of control signals.

16. The apparatus of claim 13, wherein said voltage measurement circuit comprises a voltage comparison circuit configured to compare a plurality of voltages in accordance with said stored voltage.

17. A method of monitoring the voltage of a rechargeable battery, said method comprising the steps of:

connecting resistively to a first terminal of a rechargeable battery;

connecting directly to a second terminal of said rechargeable battery;

sampling a voltage between said resistive and direct connections to said first and second rechargeable battery terminals during a first time period;

storing said sampled voltage in isolation from said resistive connection to said first rechargeable battery terminal during a second time period; and measuring said stored sampled voltage during said second time period.

18. The method of claim 17, wherein said step of connecting resistively to a first terminal of a rechargeable battery comprises connecting to said first terminal of said rechargeable battery via a fixed resistor.

19. The method of claim 17, wherein said step of sampling a voltage between said resistive and direct connections to said first and second rechargeable battery terminals during a first time period comprises sampling said voltage between said resistive and direct connections to said first and second rechargeable battery terminals via a plurality of pass transistors during said first time period.

20. The method of claim 17, wherein said step of storing said sampled voltage in isolation from said resistive connection to said first rechargeable battery terminal during a second time period comprises:

storing said sampled voltage in a capacitive circuit; and isolating said capacitive circuit from said resistive connection to said first rechargeable battery terminal during said second time period via a plurality of pass transistors.

21. The method of claim 17, wherein said step of measuring said stored sampled voltage during said second time period comprises comparing a plurality of voltages in accordance with said stored voltage during said second time period.

22. A method of monitoring a voltage of a rechargeable battery within a battery circuit which also includes a charging and discharging control circuit and for controlling, in accordance with said monitored voltage, charging and discharging of said rechargeable battery, said method comprising the steps of:

connecting via a resistor to a first terminal of a rechargeable battery within a battery circuit which includes said rechargeable battery and a charging and discharging control circuit for controlling charging and discharging of said rechargeable battery, wherein said first rechargeable battery terminal provides a first path for conveying charging and discharging currents of said rechargeable battery at a first voltage polarity;

connecting to a second terminal of said rechargeable battery, wherein said second rechargeable battery terminal provides a second path which is complementary to said first path for conveying said charging and discharging currents of said rechargeable battery at a second voltage polarity which is opposite to said first voltage polarity;

connecting to a sensing terminal of said battery circuit which provides a third path for conveying in cooperation with said second path said charging and discharging currents of said rechargeable battery substantially at said second voltage polarity;

connecting and outputting a discharge control signal to a first portion of said charging and discharging control circuit which is connected between said second rechargeable battery terminal and said battery circuit sensing terminal and is configured to control said discharging of said rechargeable battery;

connecting and outputting a charge control signal to a second portion of said charging and discharging control circuit which is connected between said second rechargeable battery terminal and said battery circuit sensing terminal and is configured to control said charging of said rechargeable battery;

sampling said voltage between said first and second IC terminals during a first time period;

storing said sampled voltage; and measuring said stored sampled voltage and in accordance therewith generating said discharge and charge control signals.

23. The method of claim 22, wherein said step of sampling said voltage between said first and second IC terminals during a first time period comprises sampling said voltage between said first and second IC terminals via a plurality of pass transistors during said first time period.

24. The method of claim 22, wherein said step of storing said sampled voltage comprises:

storing said sampled voltage in a capacitive circuit; and isolating said capacitive circuit from said resistive connection to said first rechargeable battery terminal during said second time period via a plurality of pass transistors.

25. The method of claim 22, wherein said step of measuring said stored sampled voltage and in accordance therewith generating said discharge and charge control signals comprises comparing a plurality of voltages in accordance with said stored voltage and in accordance therewith generating said discharge and charge control signals.

* * * * *